(12) United States Patent
Kuo et al.

(10) Patent No.: US 9,859,129 B2
(45) Date of Patent: Jan. 2, 2018

(54) SEMICONDUCTOR DEVICE AND MANUFACTURING METHOD OF THE SAME

(71) Applicant: Taiwan Semiconductor Manufacturing Co., Ltd., Hsinchu (TW)

(72) Inventors: Ting-Huang Kuo, Tainan (TW); Chia-Pin Lo, Tainan (TW); Wei-Barn Chen, Tainan (TW); Chen-Chieh Chiang, Kaohsiung (TW); Chii-Ming Wu, Taipei (TW); Chi-Cherng Jeng, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/054,142

(22) Filed: Feb. 26, 2016

(65) Prior Publication Data
US 2017/0250089 A1  Aug. 31, 2017

(51) Int. Cl.
| | | |
|---|---|---|
| H01L 29/167 | (2006.01) |
| H01L 29/51 | (2006.01) |
| H01L 29/78 | (2006.01) |
| H01L 21/3115 | (2006.01) |
| H01L 21/8238 | (2006.01) |
| H01L 21/3105 | (2006.01) |
| H01L 21/32 | (2006.01) |
| H01L 21/02 | (2006.01) |
| H01L 27/092 | (2006.01) |

(52) U.S. Cl.
CPC .... *H01L 21/3115* (2013.01); *H01L 21/02318* (2013.01); *H01L 21/31051* (2013.01); *H01L 21/32* (2013.01); *H01L 21/823821* (2013.01); *H01L 27/0922* (2013.01); *H01L 27/0924* (2013.01)

(58) Field of Classification Search
None
See application file for complete search history.

(56) References Cited

U.S. PATENT DOCUMENTS

| | | | | |
|---|---|---|---|---|
| 2008/0124855 A1* | 5/2008 | Widodo | .............. | H01L 21/3105 438/199 |
| 2010/0001317 A1* | 1/2010 | Chen | ................ | H01L 21/26506 257/192 |
| 2015/0179501 A1* | 6/2015 | Jhaveri | ............. | H01L 21/76224 257/506 |
| 2015/0187653 A1* | 7/2015 | Niimi | .................... | H01L 21/324 438/592 |
| 2016/0079034 A1* | 3/2016 | Yieh | ................ | H01L 21/26506 427/526 |

* cited by examiner

*Primary Examiner* — Raj R Gupta
(74) *Attorney, Agent, or Firm* — JCIPRNET

(57) ABSTRACT

Semiconductor devices and manufacturing method of the same are disclosed. A semiconductor device includes a substrate, a p-type MOS transistor, an n-type MOS transistor and a cured flowable oxide layer. The substrate includes a first region and a second region. The p-type MOS transistor is in the first region. The n-type MOS transistor is in the second region. The cured flowable oxide layer covers the p-type MOS transistor and the n-type MOS transistor, wherein a first strain of the cured flowable oxide layer applying to the p-type MOS transistor is different from a second strain of the cured flowable oxide layer applying to the n-type MOS transistor, and the difference therebetween is greater than 0.002 Gpa.

14 Claims, 18 Drawing Sheets

SEMICONDUCTOR DEVICE AND MANUFACTURING METHOD OF THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advanced techniques to be realized, similar developments in IC processing and manufacturing are needed. For example, a three dimensional transistor, such as a fin-type field-effect transistor (FinFET), has been introduced to replace a planar transistor. Although the existing FinFET devices and methods of forming FinFET devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
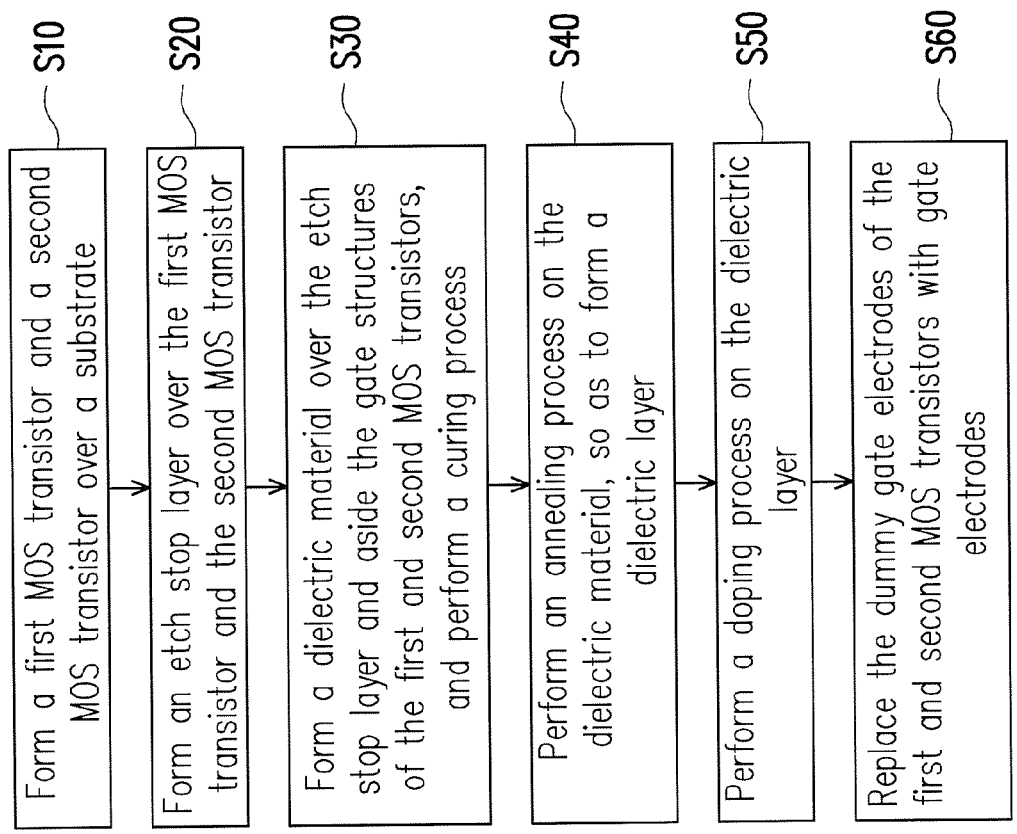
FIG. 1 is a flowchart illustrating a manufacturing method of a semiconductor device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart illustrating a manufacturing method of a semiconductor device according to some embodiments of the disclosure. FIG. 2A through FIG. 2F are schematic cross-sectional views illustrating a manufacturing process of a semiconductor device according to some embodiments of the disclosure.

Figure 2A:
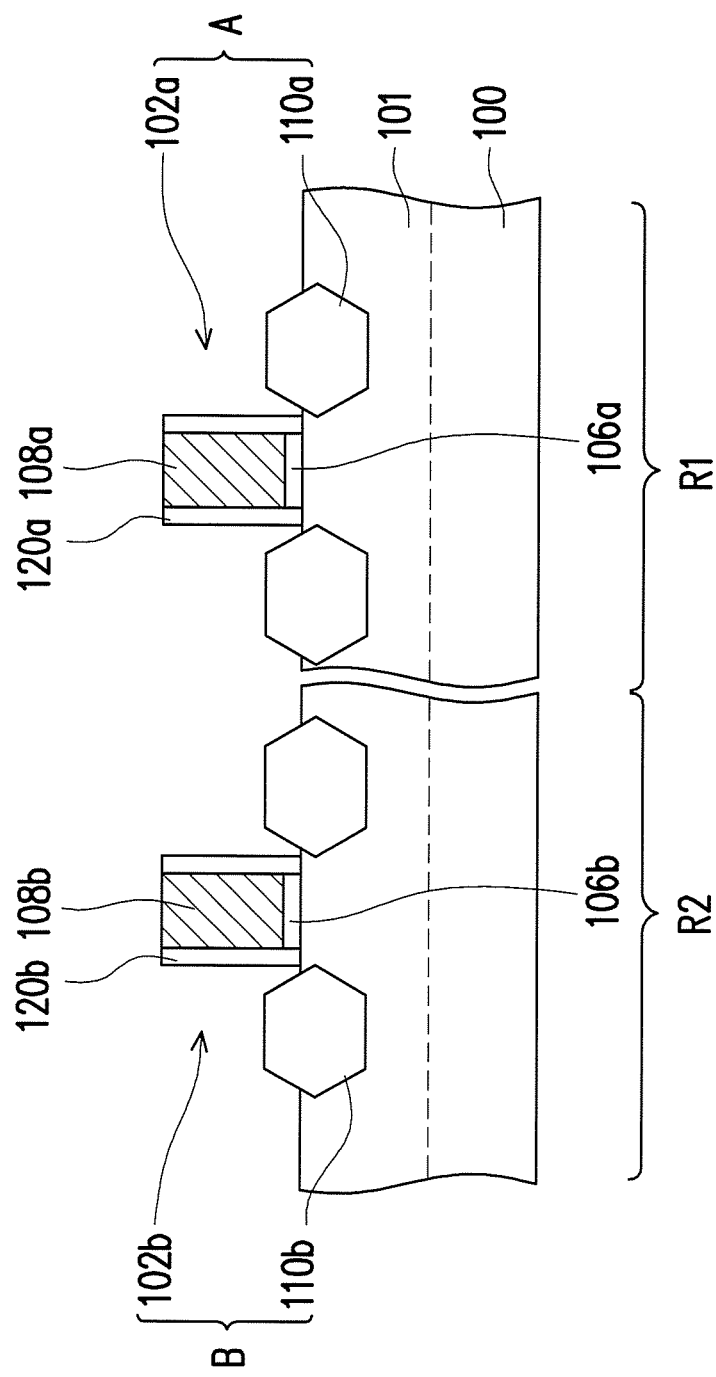
FIG. 2A through FIG. 2F are schematic cross-sectional views illustrating a manufacturing process of a semiconductor device according to some embodiments of the disclosure.

Referring to FIG. 1 and FIG. 2A, in Step 10, a first metal-oxide semiconductor (MOS) transistor A and a second MOS transistor B are formed over a substrate 100. In some embodiments, the first MOS transistor A is a first FinFET, and the second MOS transistor B is a second FinFET. In alternative embodiments, the first MOS transistor A is a first planar MOSFET, and the second MOS transistor B is a second planar MOSFET. In some embodiments, the first MOS transistor A and the second MOS transistor B shown in FIG. 2A through FIG. 2F are described as first and second planar FinFETs.

The substrate 100 is a planar substrate or a bulk substrate. In some embodiments, the substrate 100 includes one or more fins 101. An exemplary material of the substrate 100 includes silicon, an alloy semiconductor such as silicon germanium, silicon germanium carbide, gallium arsenic phosphide, or gallium indium phosphide, or other semiconductor materials. In addition, the substrate 100 may be a semiconductor on insulator such as silicon on insulator (SOI) or silicon on sapphire. Alternatively or additionally, the substrate 100 includes other elementary semiconductor materials such as germanium, gallium arsenic, or other suitable semiconductor materials. In some embodiments, the substrate 100 further includes other features such as various doped regions, a buried layer, and/or an epitaxy layer. For instances, the substrate 100 may include various doped regions depending on design requirements (e.g., p-type wells or n-type wells). The doped regions are doped with p-type dopants, such as boron or $BF_2$, and/or n-type dopants, such as phosphorus or arsenic. Moreover, the doped regions may be formed directly on the substrate 100, in a P-well structure, in an N-well structure, in a dual-well structure, or using a raised structure.

The substrate 100 is divided into a first region R1 and a second region R2. Moreover, the substrate 100 also includes isolation regions (not shown), which are formed to isolate the first MOS transistor A and the second MOS transistor B. The isolation regions utilize isolation technology, such as local oxidation of silicon (LOCOS) or shallow trench isolation (STI) to electrically isolate the various regions. If the isolation regions are made of STIs, the STI region includes silicon oxide, silicon nitride, silicon oxynitride, other suitable materials, or a combination thereof. In some examples, the filled trench has a multi-layer structure such as a thermal oxide liner layer filled with silicon nitride or silicon oxide.

The first MOS transistor A is formed in the first region R1 and the second MOS transistor B is formed in the second region R2. The first MOS transistor A includes a first gate structure 102a and first doped source and drain (S/D) regions 110a. Similarly, the second MOS transistor B includes a second gate structure 102b and second doped source and drain (S/D) regions 110b. In some embodiments, the first MOS transistor A and the second MOS transistor B are similar. Nevertheless, the dopant type implanted into the first doped S/D regions 110a and the second doped S/D regions 110b are different. In other words, the first MOS transistor A and the second MOS transistor B are of different conductive types. In detail, the semiconductor substrate 100 includes various active regions, such as regions configured for NMOS transistors and regions configured for PMOS transistors. That is, the substrate 100 has dopant regions and epitaxial layers formed in the first doped S/D regions 110a and the second doped S/D regions 110b. In some embodiments, the first doped S/D regions 110a are doped with p-type dopants and the second doped S/D regions 110b are doped with n-type dopants. Based on these dopant types, the first MOS transistor A is a p-type FinFET, and the second MOS transistor B is an n-type FinFET. In alternative embodiments, the types of the dopants are interchanged to render opposite conductive type MOS transistors. It should be noted that the dopant in some embodiments are doped into the S/D regions through ion implantation. Alternatively, in some other embodiments, part of the substrate 100 is removed through etching or other suitable processes and the dopants are formed in the hollowed area through epitaxy growth. Specifically, the epitaxial layers include SiGe, SiC, or other suitable materials. In some embodiments, the S/D regions 110a of the first MOS transistor A includes SiGe, and the S/D regions 110b of the second MOS transistor B includes SiP, for example. It is understood that the semiconductor device structure may be formed by CMOS technology processing, and thus some processes are not described in detail herein.

In some embodiments, the first gate structure 102a includes a first gate dielectric layer 106a, a first gate electrode 108a, and first spacers 120a. Similarly, the second gate structure 102b includes a second gate dielectric layer 106b, a second gate electrode 108b, and second spacers 120b. In some embodiments, the first gate structure 102a and the second gate structure 102b are similar or identical. In some other embodiments, the elements in the second gate structure 102b are different from the elements in the first gate structure 102a. It should be noted that the detail described below with respect to the elements of the first gate structure 102a may also apply to the elements of the second gate structure 102b, and thus the description of the elements in the second gate structure 102b are omitted.

The first gate dielectric layer 106a and the first gate electrode 108a are formed over the substrate 100 in sequential order from bottom to top. The first gate dielectric layer 106a includes silicon oxide, silicon nitride, silicon oxynitride, high-k dielectric materials, or a combination thereof. It should be noted that the high-k dielectric materials are generally dielectric materials having a dielectric constant greater than 4. High-k dielectric materials include metal oxides. Examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or a combination thereof. In some embodiments, the first gate dielectric layer 106a is a high-k dielectric layer with a thickness in the range of about 10 to 30 angstroms. The first gate dielectric layer 106a is formed by using a suitable process such as atomic layer deposition (ALD), chemical vapor deposition (CVD), physical vapor deposition (PVD), flowable chemical vapor deposition (FCVD), thermal oxidation, UV-ozone oxidation, or a combination thereof.

In some embodiments, the first gate electrode 108a serves as a dummy gate electrode, and the first gate electrode 108a is made of polysilicon. A metal gate (or called "replacement gate") would replace the dummy gate electrode in subsequent steps. The replacing step would be discussed in greater detail later.

Referring to FIG. 2A, the first spacers 120a are formed over sidewalls of the first gate electrode 108a. The first spacers 120a is formed by silicon oxide, silicon nitride, silicon oxynitride, silicon carbide, fluoride-doped silicate glass (FSG), low-k dielectric materials, or a combination thereof. It should be noted that the low-k dielectric materials are generally dielectric materials having a dielectric constant lower than 3.9. The first spacers 120a may have a multi-layer structure which includes one or more liner layers. The liner layer includes a dielectric material such as silicon oxide, silicon nitride, and/or other suitable materials. The formation of the first spacers 120 and the second spacers 120b can be achieved by depositing suitable dielectric material and anisotropically etching off the dielectric material.

Figure 2B:
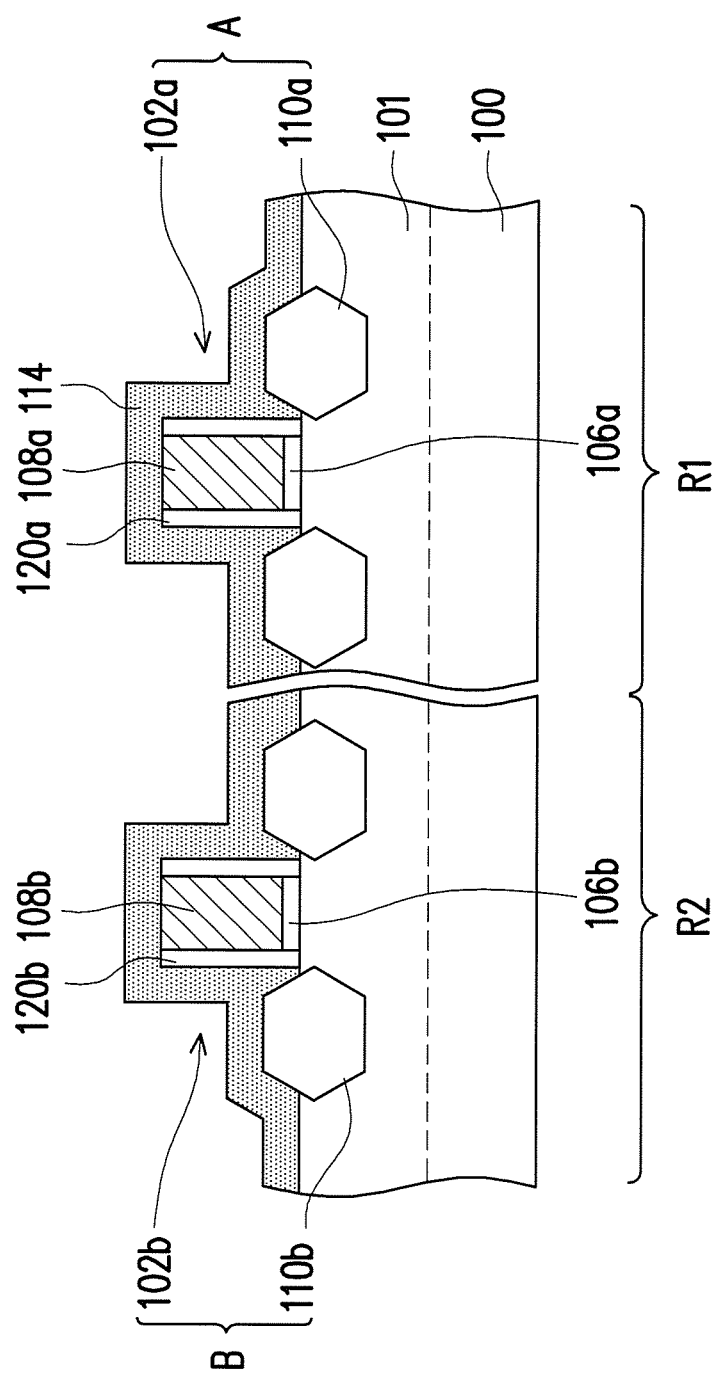

Referring to FIG. 1 and FIG. 2B, in Step S20, an etch stop layer 114 is formed over the first MOS transistor A and the second MOS transistor B. Specifically, the etch stop layer 114 is formed to overlay the first MOS transistor A and the second MOS transistor B, as illustrated in FIG. 2B. In some embodiments, the etch stop layer 114 is a contact etch stop layer (CESL). The etch stop layer 114 includes, for example, silicon nitride, carbon-doped silicon nitride, or a combination thereof. In some embodiments, the etch stop layer 114 is, for example, deposited by using processes such as CVD, high density plasma (HDP) CVD, sub-atmospheric CVD (SACVD), molecular layer deposition (MLD), or other suitable methods. In some embodiments, before the etch stop layer 114 is formed, a buffer layer (not shown) is further formed over the substrate 100. In an embodiment, the buffer layer is an oxide such as silicon oxide, however, the disclosure is not limited thereto, other composition may be utilized. In some embodiments, the buffer layer is deposited by processes such as CVD, HDPCVD, SACVD, MLD, or other suitable methods.

Figure 2C:
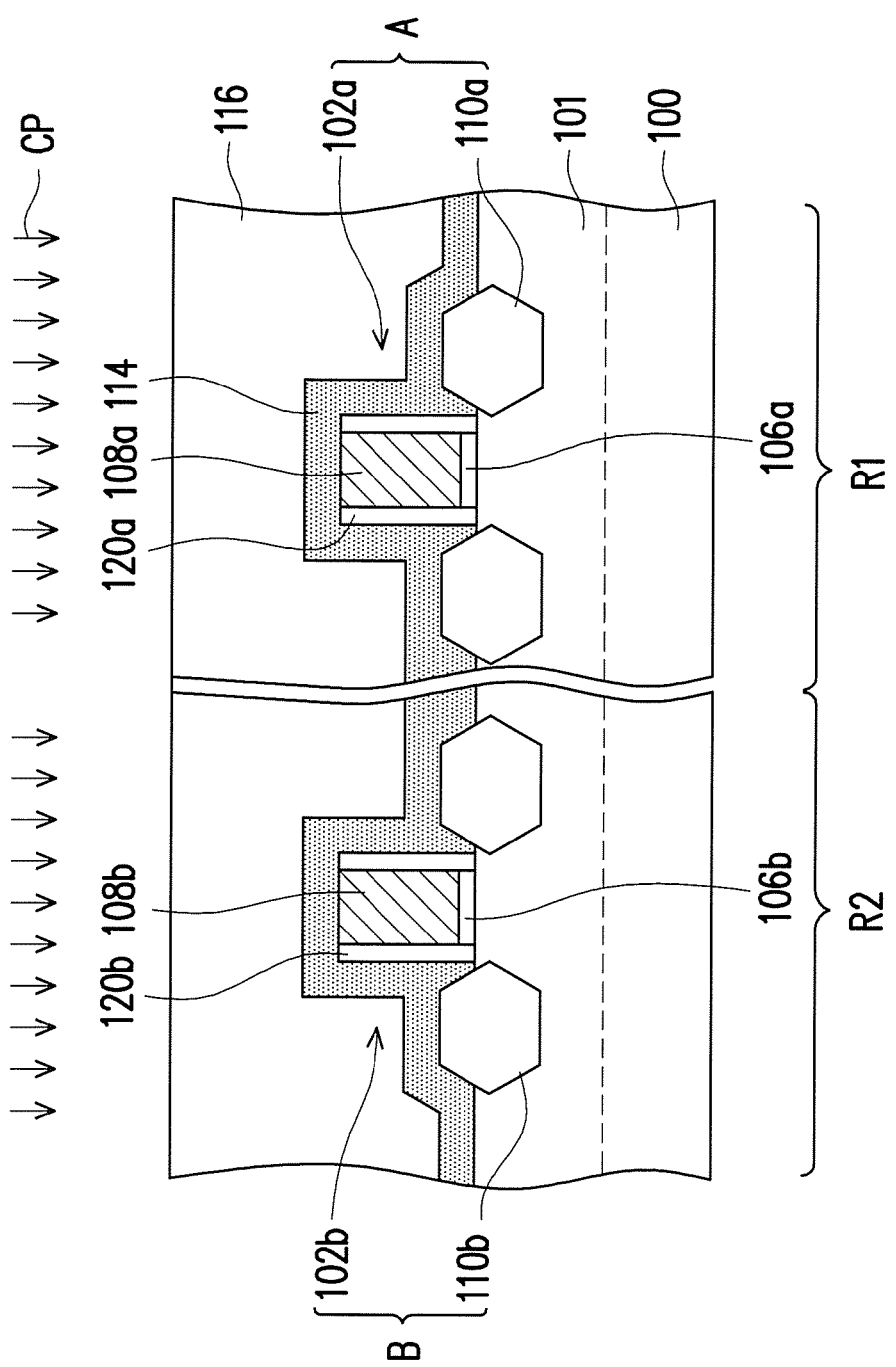

Referring to FIG. 1 and FIG. 2C, in Step S30, a dielectric material 116 is formed over the etch stop layer 116 and aside the first gate structure 102a and the second gate structure 102b, and a curing process CP is performed on the dielectric material 116. In some embodiments, the dielectric material 116 is an interlayer dielectric layer (ILD). In some embodiments, the dielectric material 116 includes a flowable oxide material. The flowable oxide material includes, but not limited to, polymer silicate, a siloxane, a methyl SilsesQuioxane (MSQ), a hydrogen SisesQuioxane (HSQ), an MSQ/HSQ, a perhydrosilazane (TCPS), a perhydro-polysilazane (PSZ), other suitable materials, or a combination thereof. The flowable oxide material is formed over the substrate 100 and the epitaxial layers of the first doped S/D regions 110a and the second doped S/D regions 110b. The flowable oxide material is formed by deposition processes such as a spin on glass (SOG), flowable chemical vapor deposition (FCVD) process, or other suitable processes. After deposition, the curing process CP is performed on the flowable oxide material, that is, the dielectric material 116 is baked at a temperature ranging from about 150 to 400° C. for a duration ranging from about 5 to 30 minutes.

Figure 2D:
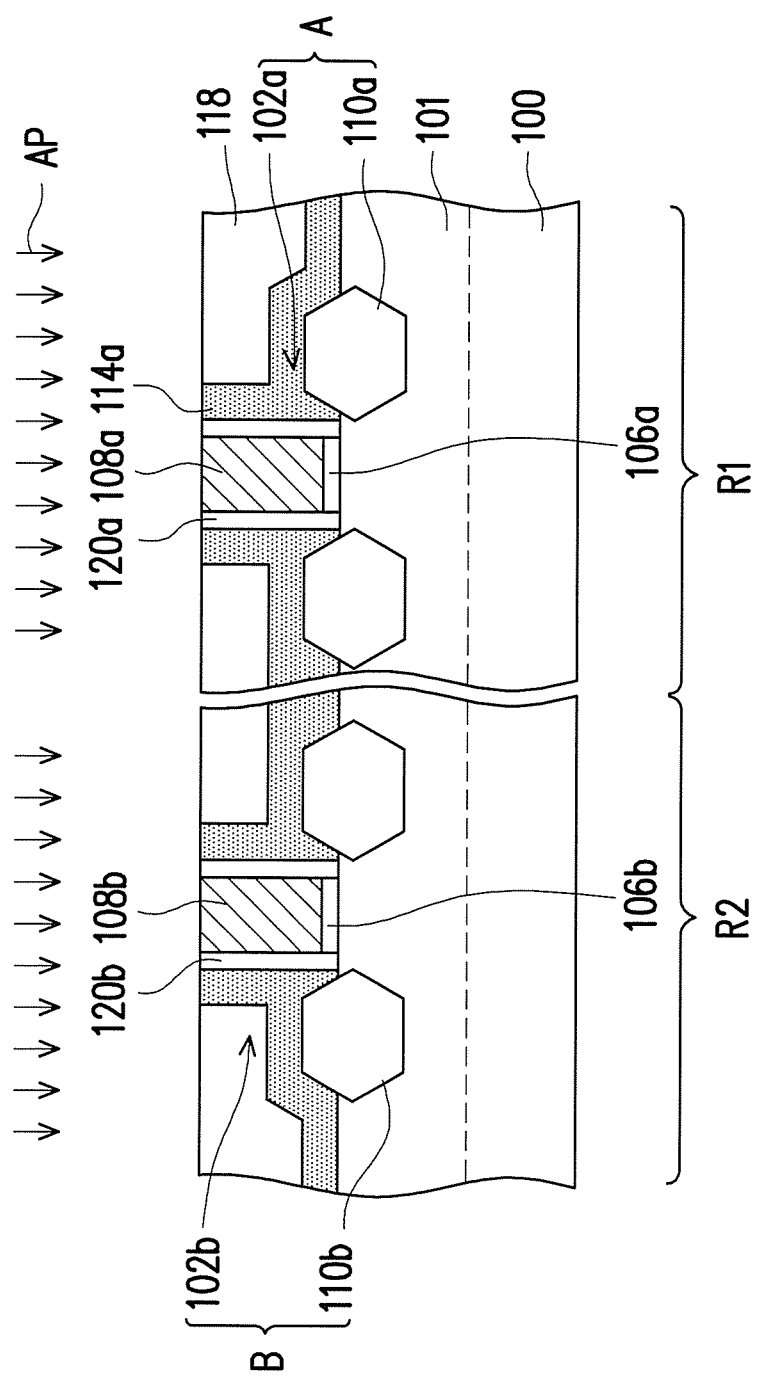

Referring to FIG. 1 and FIG. 2D, in Step S40, an annealing process AP is performed on the dielectric material 116, so as to form a dielectric layer 118. In some embodiments, a removal process is performed on the dielectric material 116 after the annealing process AP. In some embodiments, an additional annealing process and an additional removal process are sequentially performed on the dielectric material 116 after the annealing process AP and the removal process. In detail, the annealing process AP removes the solvent and densifies the dielectric material 116, and the removal process removes a portion of the dielectric material 116. The additional annealing process completely cures the flowable oxide material. The additional removal process removes a portion of the dielectric material 116 and a portion of the etch stop layer 114, such that a top surface of the first gate electrode 108a and a top surface of the second gate electrode 108b are exposed. In the annealing process and the additional annealing process, the dielectric material 116 is heated at a temperature ranging from about 400 to 800° C. for a duration ranging from about 1 to 6 hours. In some embodiments, the removal processes are, for example, a chemical mechanical polishing (CMP) process, an etching process, or other suitable processes. As illustrated in FIG. 2D, after the additional removal process, the first spacers 120a and the etch stop layer 114a are between the dielectric layer 118 and the first gate electrode 108a. Similarly, the second spacers 120b and the etch stop layer 114a are between the dielectric layer 118 and the second gate electrode 108b. After the additional removal process, the dielectric layer 118 has a thickness in the range of about 500 to 600 angstroms.

Figure 2E:
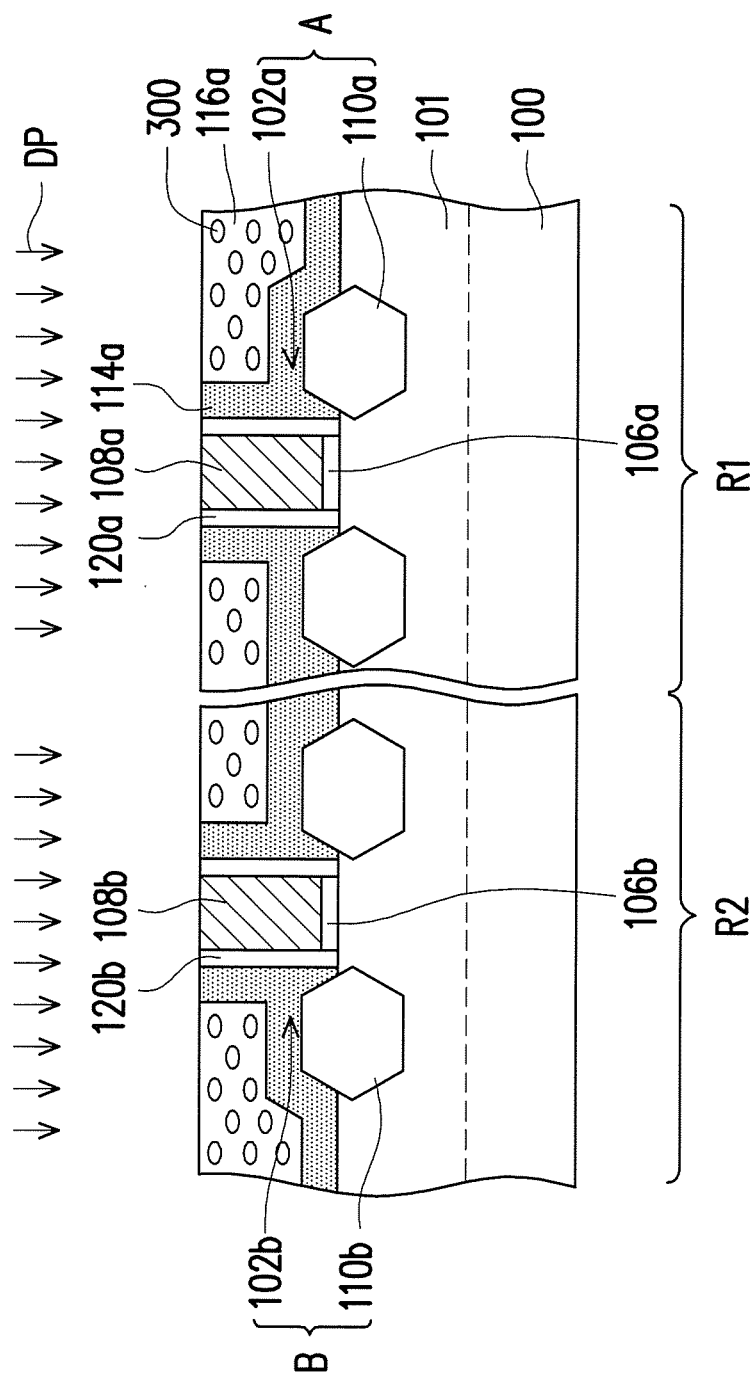

Referring to FIG. 1 and FIG. 2E, in Step S50, a doping process DP is performed on the dielectric layer 118. In some embodiments, the dielectric layer 118 formed by the flowable oxide material is a tensile film and would render high strain within the layer. As such, a dopant 300 may be introduced into the dielectric layer 118 to modulate a strain of the dielectric layer 118. In detail, the dopant 300 may be a strain reducer, a strain enhancer, or other modulators to alter the strain of the dielectric layer 118. For example, the dopant 300 having a larger size (such as Ge and As) is a compressive strain enhancer, and the dopant 300 having a smaller size (such as B and C) is a tensile strain enhancer. In some embodiments, the dopant 300 is doped into the dielectric layer 118 which is over the first MOS transistor A and the second MOS transistor B. The dopant 300 may be an atom, a molecule, an ion, or may exist in other possible forms. In some embodiments, the dopant 300 includes, but not limited to, an element of the Group IA, an element of the Group III to Group V or a combination thereof. In some embodiments, the dopant 300 includes He, Ne, Ar, Kr, Xe, Rn, B, C, N, O, F, As, Sb, Ge, Sn, Ga, In, and/or a combination thereof. In some embodiments, other suitable materials may be utilized as the dopant 300 of the present disclosure as long as the material satisfies the required strain of the doped dielectric layer 118. In some embodiments, a patterned mask layer (not shown) is formed over the substrate 100 and has an opening which exposes the first region R1 and the second region R2. In other words, the patterned mask layer exposes the first MOS transistor A, the second MOS transistor B, the etch stop layer 114a, and the dielectric layer 118 formed in the first region R1 and the second region R2. Since the first region R1 and the second region R2 are not being shielded by the patterned mask layer, the dopant 300 is doped into the entire dielectric layer 118 in the first region R1 and the second region R2 during the doping process DP. In alternative embodiment, a patterned mask layer is utilized to cover one of the first and second regions R1, R2 and exposes the other one of the first and second regions R1, R2. For example, the patterned mask is formed over the substrate 100 and has an opening which exposes the first region R1 while the second region R2 is covered. During the doping process DP, the dopant 300 is doped into the dielectric layer 118 in the first region R1 since the first region R1 is exposed by the opening of the patterned mask layer. In alternative embodiment, the doping process DP can be performed between the curing process CP and the annealing process AP.

The doping process DP is achieved by, for example, an ion implantation process (IMP). When an IMP process is adapted, an energy may be 10 KeV to 50 KeV, for example. In addition, a dosage of the dopant 300 ranges from $1\times10^{15}$ atom/cm$^2$ to $1\times10^{16}$ atom/cm$^2$, for example. A depth of the dopant 300 ranges from about 0 to 600 angstroms, for example.

Figure 2F:
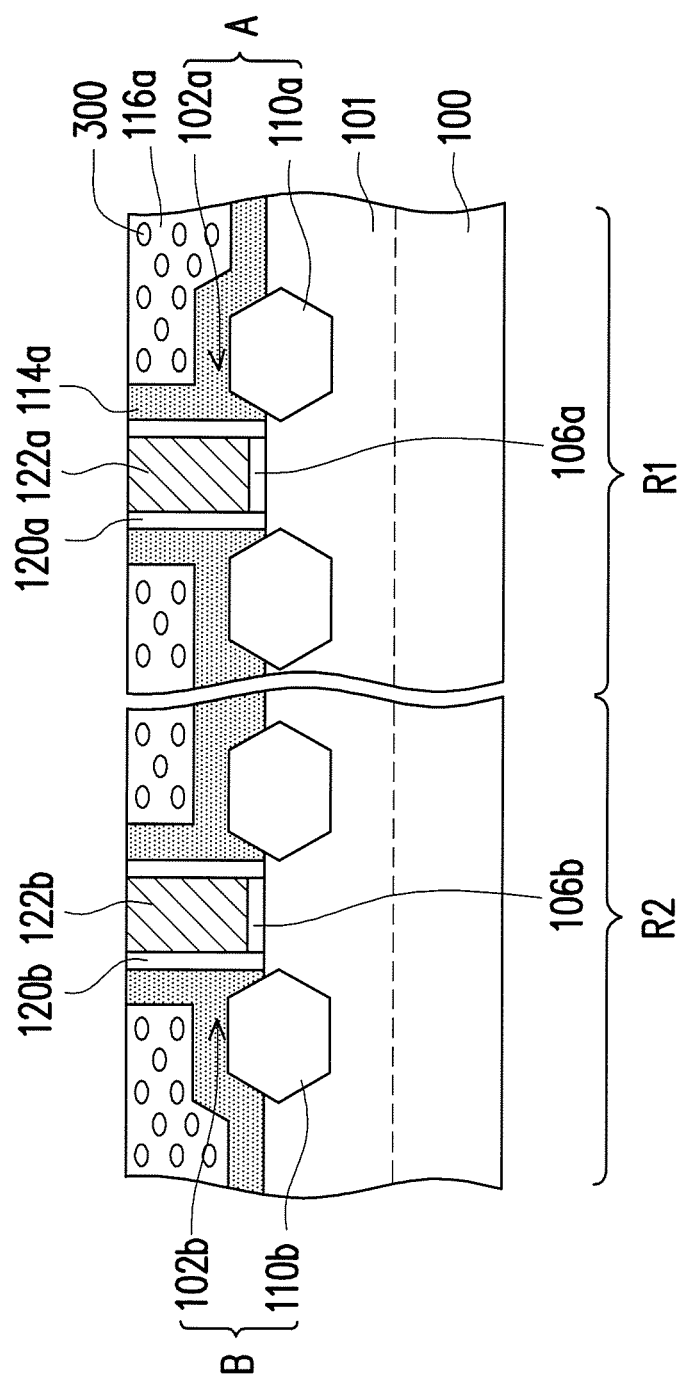

Referring to FIG. 1 and FIG. 2F, in Step S60, in some embodiments, the first gate electrode 108a and the second gate electrode 108b are dummy gate electrodes, which are being replaced respectively by a first gate electrode 122a and a second gate electrode 122b. Specifically, the material of the first gate electrode 108a and the second gate electrode 108b is polysilicon and the material of the first gate electrode 122a and the second gate electrode 122b includes metal. In some embodiments, one of the first gate electrode 122a and second gate electrode 122b includes TiN, WN, TaN, or Ru for a PMOS device, and the other of the first gate electrode 122a and second gate electrode 122b includes Ti, Ag, Al, TiAl, TiAlN, TaC, TaCN, TaSiN, Mn, or Zr for an NMOS device. Moreover, the first gate electrode 122a and the second gate electrode 122b may further include a barrier, a work function layer, or a combination thereof. It should be noted that, in alternative embodiments, a liner layer, an interfacial layer, a seed layer, an adhesion layer, or a combination thereof may be further included between the first gate electrode 122a and the substrate 100 or/and between the second gate electrode 122b and the substrate 100.

In some embodiments, the first gate electrode 108a and the second gate electrode 108b are removed through an etching process or other suitable processes. On the other hand, the first gate electrode 122a and the second gate electrode 122b are formed by depositing a metal material (not shown) through suitable processes such as ALD, CVD, PVD, plating, or a combination thereof. After depositing the metal material, a portion of the metal material is removed to expose top surfaces of the first spacers 120a, the second spacers 120b, the etch stop layer 114a, and the dielectric layer 118. For example, the first gate electrode 122a and the second gate electrode 122b may have thicknesses in the range of about 30 nm to about 60 nm. The process of removing the portion of the metal material may be achieved by a chemical mechanical polishing (CMP) process, an etching process, or a combination thereof.

In alternative embodiments, the first gate dielectric layer 106a and the second gate dielectric layer 106b are removed together with the first gate electrode 108a and the second gate electrode 108b to form a gate trench. Subsequently, an interfacial layer (not shown), another gate oxide layer (not shown), and metal gate electrodes 122a, 122b are formed in the gate trench. For example, the interfacial layer may be used in order to create a good interface between the fin 101 and the first gate dielectric layer 106a, as well as to suppress the mobility degradation of the channel carrier of the semiconductor device. Moreover, the interfacial layer is formed by a thermal oxidation process, a chemical vapor deposition (CVD) process, or an atomic layer deposition (ALD) process. A material of the interfacial layer includes a dielectric material, such as a silicon oxide layer, a silicon oxynitride layer, or the likes.

Since the first and second gate electrodes 108a, 108b are being replaced by the first and second metallic gate electrodes 122a, 122b, subsequent process of forming metallic interconnection (not shown) can be implemented. For instance, other conductive lines (not shown) are formed to electrically connect the first and second gate electrodes 122a, 122b with other elements in the semiconductor device.

In some embodiments, by controlling the curing or annealing condition of the flowable oxide material, or doping a dopant into the cured dielectric layer formed by the flowable oxide material, the strain of the dielectric layer 118 is changed. Since the dielectric layer 118 causes opposite effects on the first MOS transistor A and the second MOS transistor B, the strain of the dielectric layer 118 applying to the first MOS transistor A is different from the strain of the dielectric layer 118 applying to the first MOS transistor B, where the difference therebetween is, for example, greater than 0.002 Gpa. In other words, the strain of the dielectric layer 118 applying to the first MOS transistor A and the strain of the dielectric layer 118 applying to the second MOS transistor B can be easily modulated. Thus, the mobility of the first MOS transistor A and the mobility of the second MOS transistor B are fine tuned. Furthermore, since the curing, annealing and doping processes exist in the current semiconductor device manufacturing method, the method for tuning the strain of the dielectric layer 118 is simplified without increasing cost.

Figure 3:
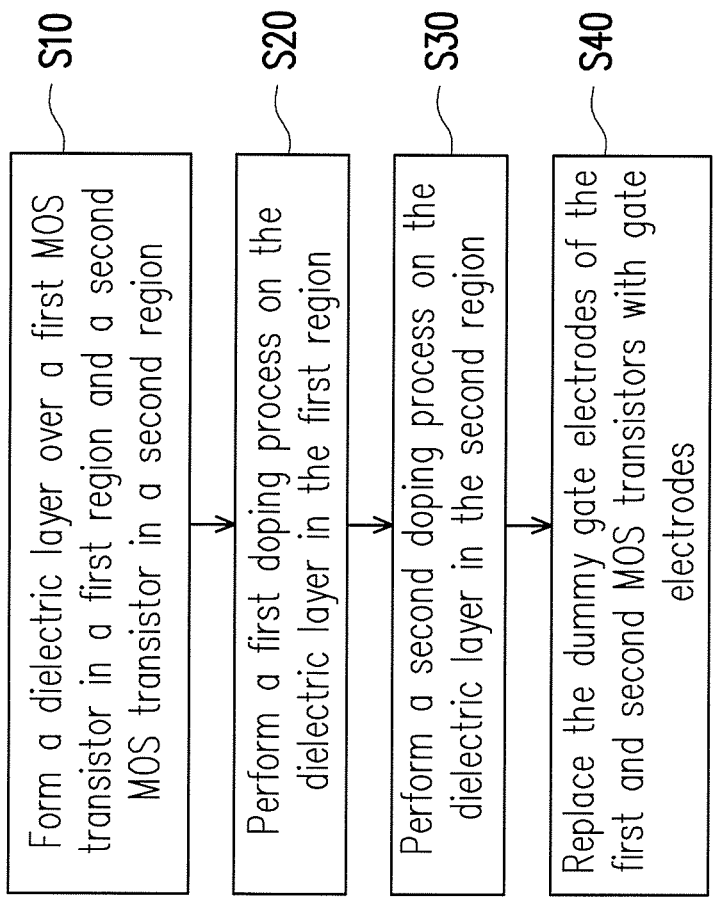
FIG. 3 is a flowchart illustrating a manufacturing method of a semiconductor device according to some embodiments of the disclosure.
Figure 4A:
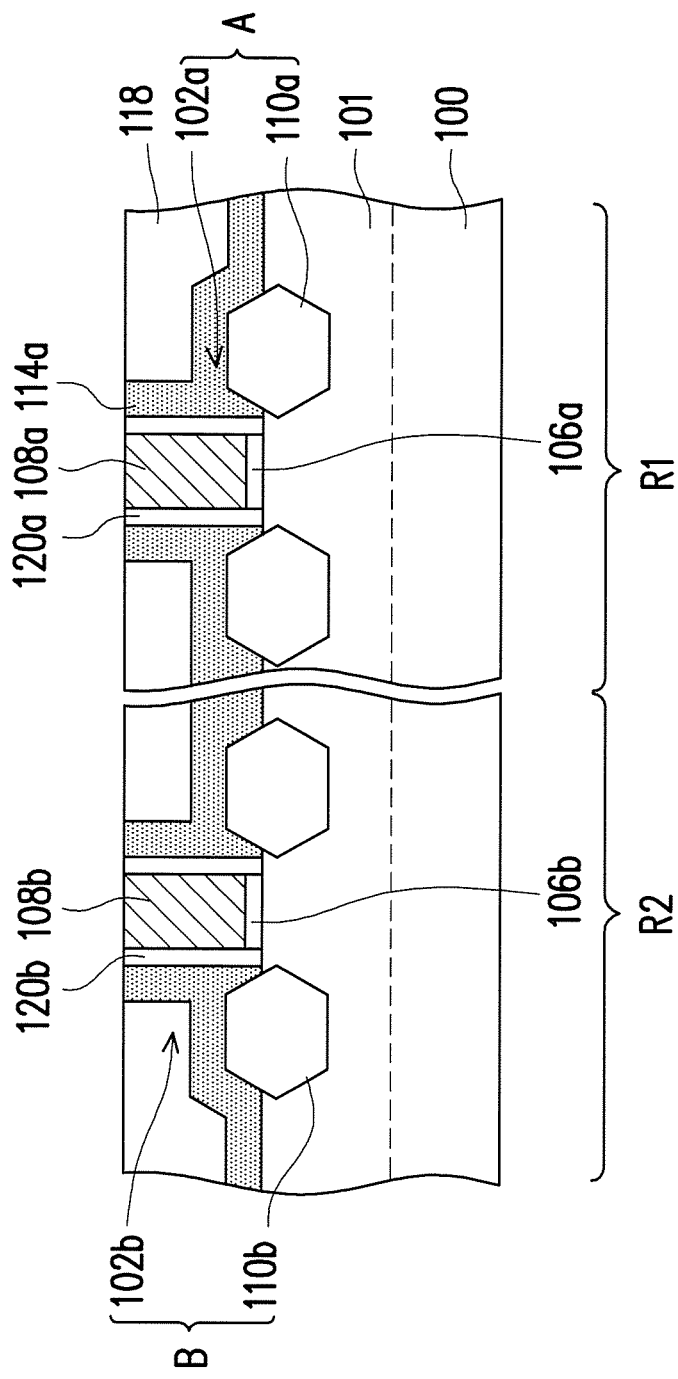
FIG. 4A through FIG. 4D are schematic cross-sectional views illustrating a manufacturing process of a semiconductor device according to some embodiments of the disclosure.

FIG. 3 is a flowchart illustrating a manufacturing method of a semiconductor device according to some embodiments of the disclosure. FIG. 4A through FIG. 4D are schematic cross-sectional views illustrating a manufacturing process of a semiconductor device according to some embodiments of the disclosure. The semiconductor device provided in the present embodiment is similar to the semiconductor device depicted in FIG. 2F, and therefore, identical elements in these figures will be denoted with the same numerals and will not be described repeatedly hereinafter. The difference between the two embodiments lies in that, in the present embodiment, the doping process is performed on the dielectric layer in the first region and the second region, respectively. Referring to FIG. 3 and FIG. 4A, in Step S10, a dielectric layer 118 is formed over a first MOS transistor A in a first region R1 and a second MOS transistor B in a second region R2. In some embodiments, material and forming method of the dielectric layer 118 are similar to those of the dielectric layer 118 depicted in FIG. 2D, and thus it is not repeated here.

Figure 4B:
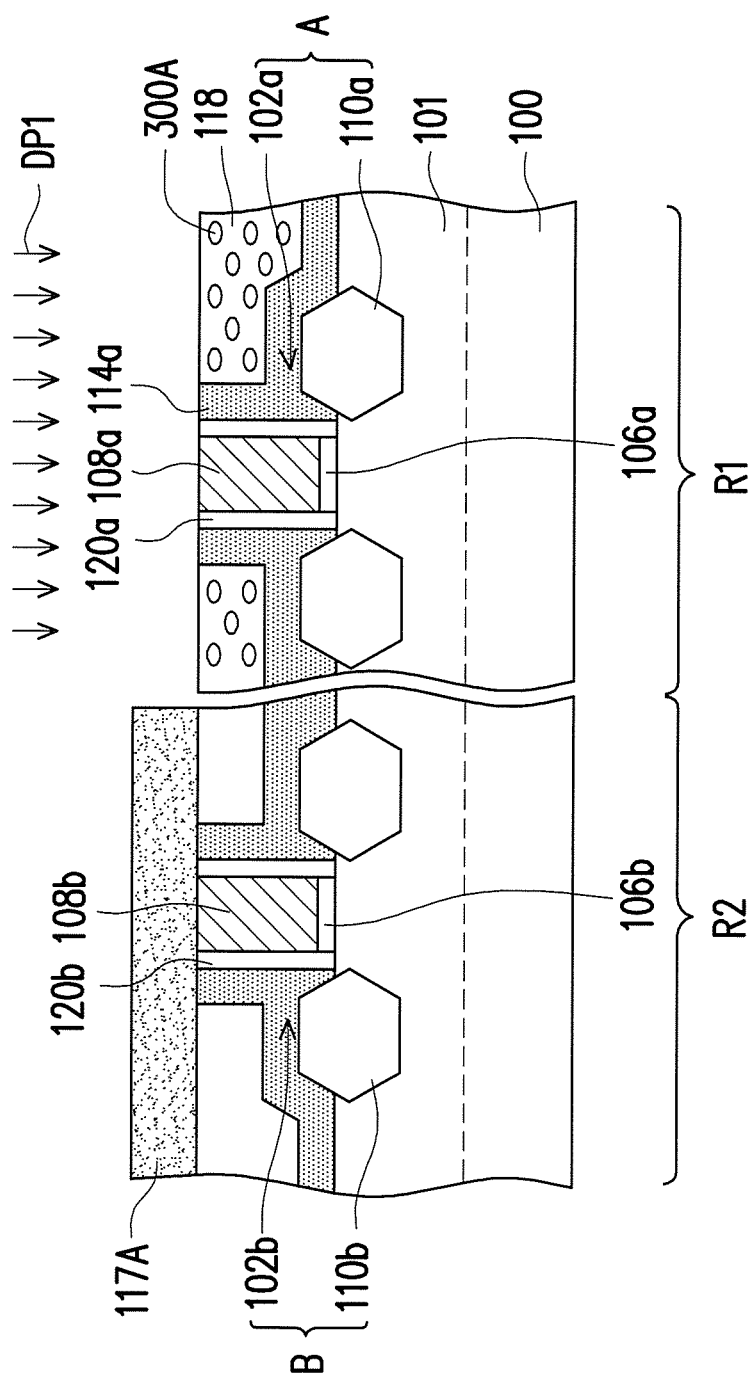

Referring to FIG. 3 and FIG. 4B, in Step S20, a first doping process DP1 is performed on the dielectric layer 118 in the first region R1. Specifically, a first mask 117A is formed over the substrate 100 to cover the dielectric layer 118 in the second region R2 and expose the dielectric layer 118 in the first region R1, and thus a first dopant 300A is doped into the dielectric layer 118 in the first region R1 by the first doping process DP1. In some embodiments, when the first MOS transistor A is a p-type MOS, the first dopant 300A is, but not limited to, a compressive strain enhancer such as Ge, As or other suitable dopants having a large size.

Figure 4C:
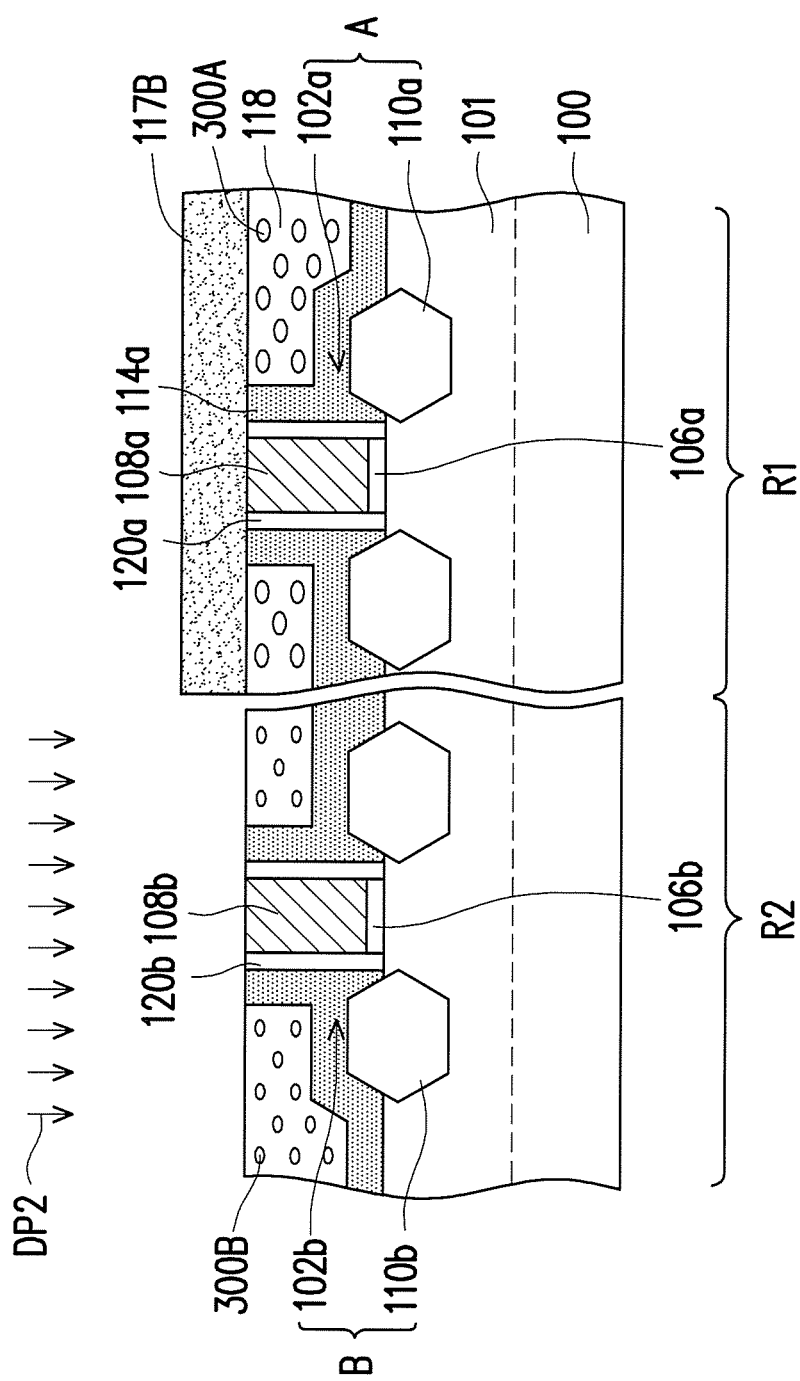

Referring to FIG. 3 and FIG. 4C, in Step S30, a second doping process DP2 is performed on the dielectric layer 118 in the second region R2. Specifically, a second mask 117B is formed over the substrate 100 to cover the dielectric layer 118 in the first region R1 and to expose the dielectric layer 118 in the second region R2, and thus a second dopant 300B is doped into the dielectric layer 118 in the second region R2 by the second doping process DP2. In some embodiments, when the second MOS transistor B is an n-type MOS, the second dopant 300B is, but not limited to, a tensile strain enhancer such as B, C or other suitable dopants having a small size. In alternative embodiment, the second dopant 300B has a larger size than the first dopant 300A. In alternative embodiment, both of the first dopant 300A and the second dopant 300B may be compressive strain enhancer or tensile strain enhancer, and the dosage of the first dopant 300A and the dosage of the second dopant 300B are different. In alternative embodiment, the difference between the dosage of the first doping process DP1 and the dosage of the second doping process DP2 is at least greater than $1 \times 10^{15}$ atom/cm$^2$. In alternative embodiment, one of the first and second doping processes DP1, DP2 may be performed on the dielectric layer 118 in both of the first region R1 and the second region R2.

Figure 4D:
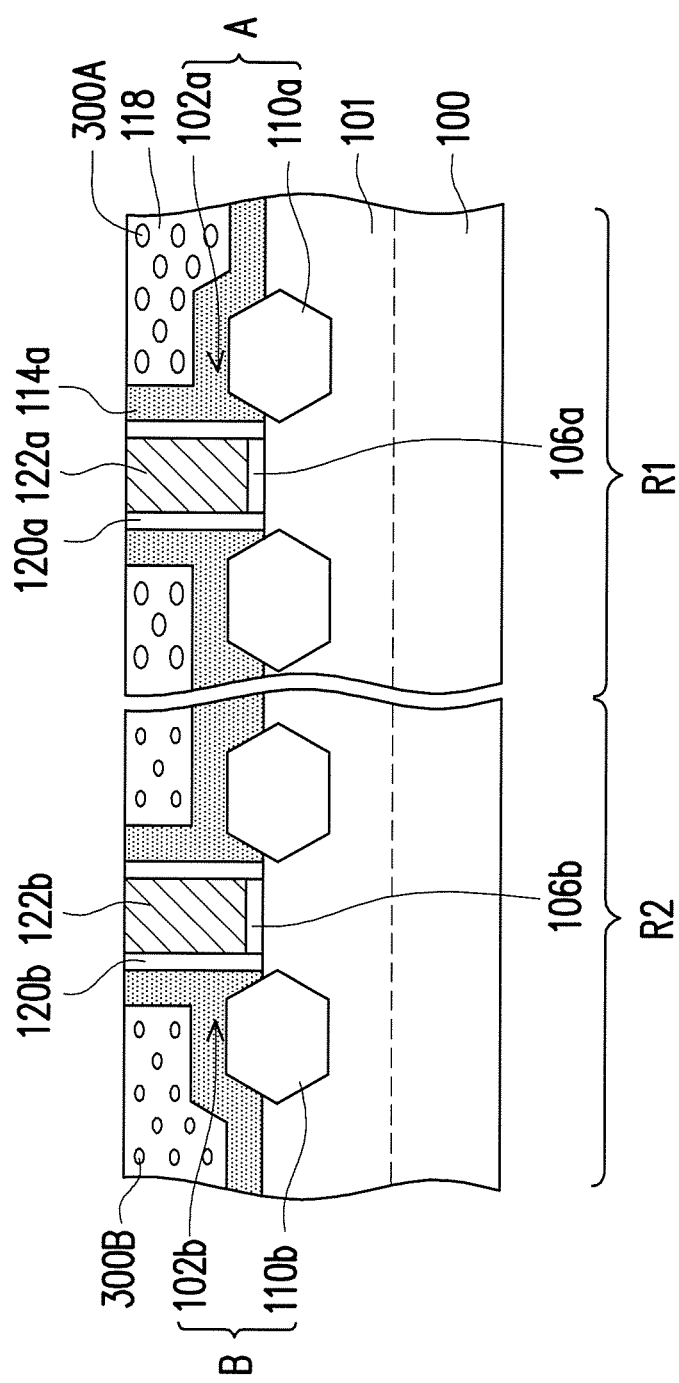

Referring to FIG. 3 and FIG. 4D, in Step S40, in some embodiments, the first gate electrode 108a and the second gate electrode 108b are dummy gate electrodes, and are being replaced respectively by a first gate electrode 122a and a second gate electrode 122b. In some embodiments, the semiconductor device depicted in FIG. 4D is similar to the semiconductor device depicted in FIG. 2F, and thus it is not repeated here.

In some embodiments, by respectively performing the doping processes on the dielectric layer 118 in the first region R1 and the second region R2, the strain of the dielectric layer 118 in the first region R1 and the strain of the dielectric layer 118 in the second region R2 are different. In addition, at least one of dopant concentration, H—N bonding and porosity of the dielectric layer 118 is different in the first region R1 and the second region R2. In some embodiments, the difference between the strain of the dielectric layer 118 in the first region R1 and the strain of the dielectric layer 118 in the second region R2, measured by warpage measurement method, is greater than 0.002 Gpa. In some embodiments, the difference between the dopant concentration of the dielectric layer 118 in the first region R1 and the dopant concentration of the dielectric layer 118 in the second region R2 is greater than $1 \times 10^{15}$ atom/cm$^2$. In some embodiments, the difference between the H—N bonding of the dielectric layer 118 in the first region R1 and the H—N bonding of the dielectric layer 118 in the second region R2, measured in transmittance by FTIR method, is greater than 5%. In some embodiments, the difference between the porosity of the dielectric layer 118 in the first region R1 and the porosity of the dielectric layer 118 in the second region R2, measured by small angle x-ray/neutron scattering method, is greater than 3%. Accordingly, the mobility of the first MOS transistor A and the mobility of the second MOS transistor B are fine tuned.

Figure 5:
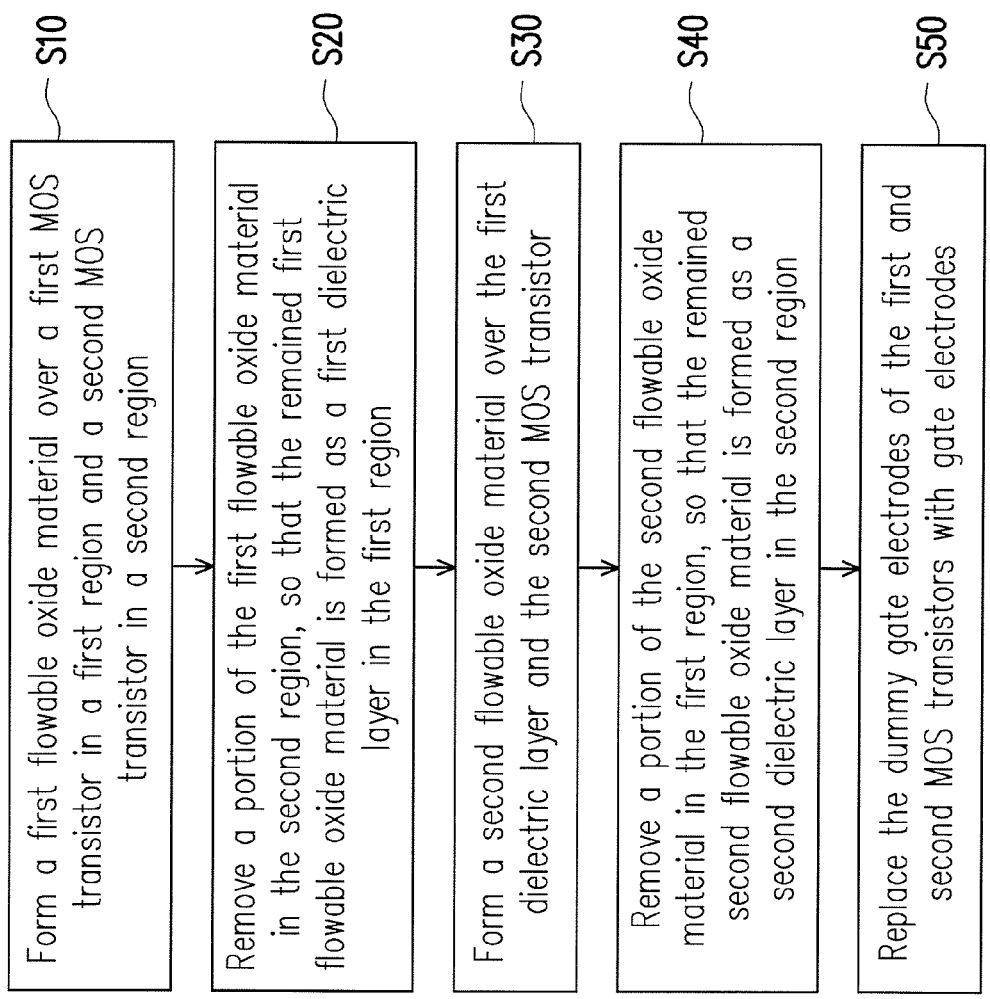
FIG. 5 is a flowchart illustrating a manufacturing method of a semiconductor device according to some embodiments of the disclosure.
Figure 6A:
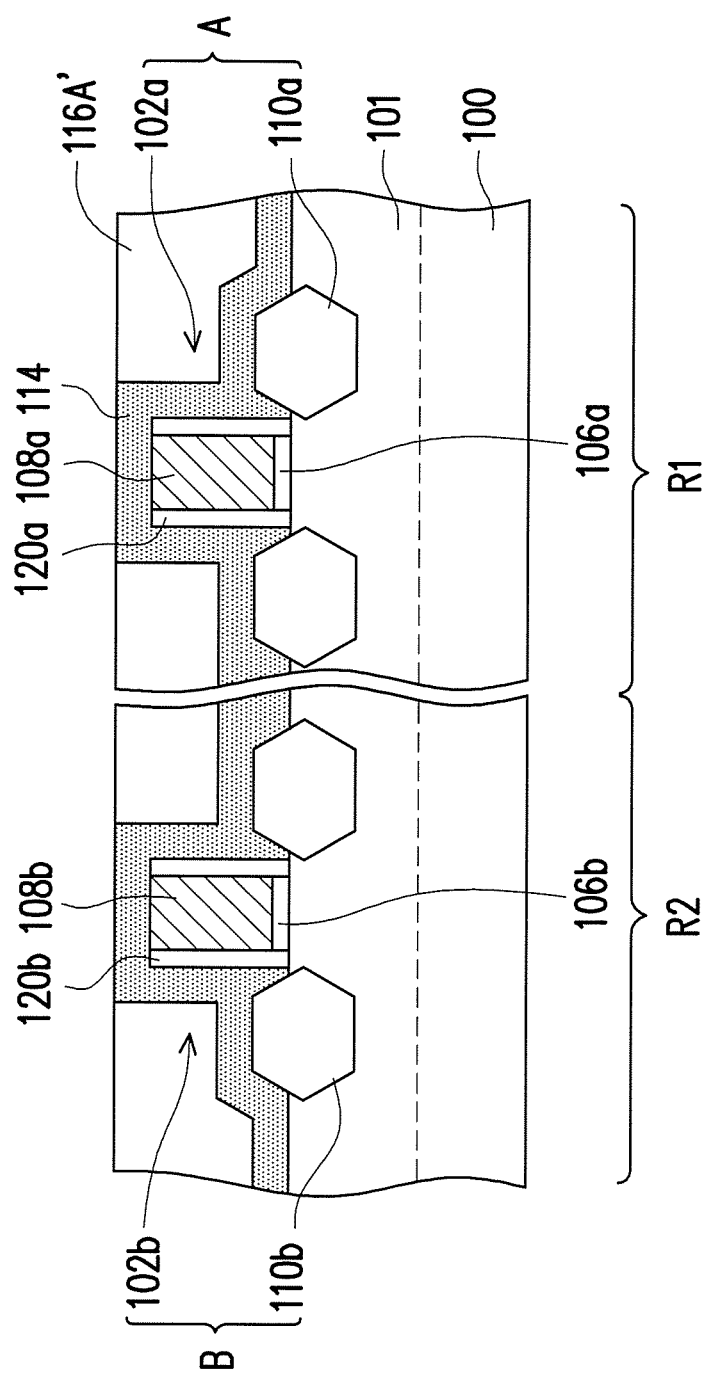
FIG. 6A through FIG. 6E are schematic cross-sectional views illustrating a manufacturing process of a semiconductor device according to some embodiments of the disclosure.

FIG. 5 is a flowchart illustrating a manufacturing method of a semiconductor device according to some embodiments of the disclosure. FIG. 6A through FIG. 6E are schematic cross-sectional views illustrating a manufacturing process of a semiconductor device according to some embodiments of the disclosure. The semiconductor device provided in the present embodiment is similar to the semiconductor device depicted in FIG. 2F, and therefore, identical elements in these figures will be denoted with the same numerals and will not be further described hereinafter. The difference between the two embodiments is described below. Referring to FIG. 5 and FIG. 6A, in Step S10, a first flowable oxide material 116A' is formed over a first MOS transistor A in a first region and a second MOS transistor B in a second region. In some embodiments, the first flowable oxide material 116A' is formed by sequentially performing a first deposition process, a first curing process, and a first annealing process. In some embodiments, a first removal process is optionally performed after the first annealing process, such that a portion of the cured first flowable oxide material 116A' is removed. In some embodiments, after the first removal process, a top surface of the first gate electrode 108a and a top surface of the second gate electrode 108b are exposed, for example. In some embodiments, the first flowable oxide material 116A' is similar to the flowable oxide material described in the embodiments in FIG. 2C. The first deposition process, the first curing process, the first annealing process and the first removal process are similar to the deposition process and the curing process described in the embodiments in FIG. 2C and the annealing process and the removal process described in the embodiments in FIG. 2D. Thus, the detail of which are not repeated here.

Figure 6B:
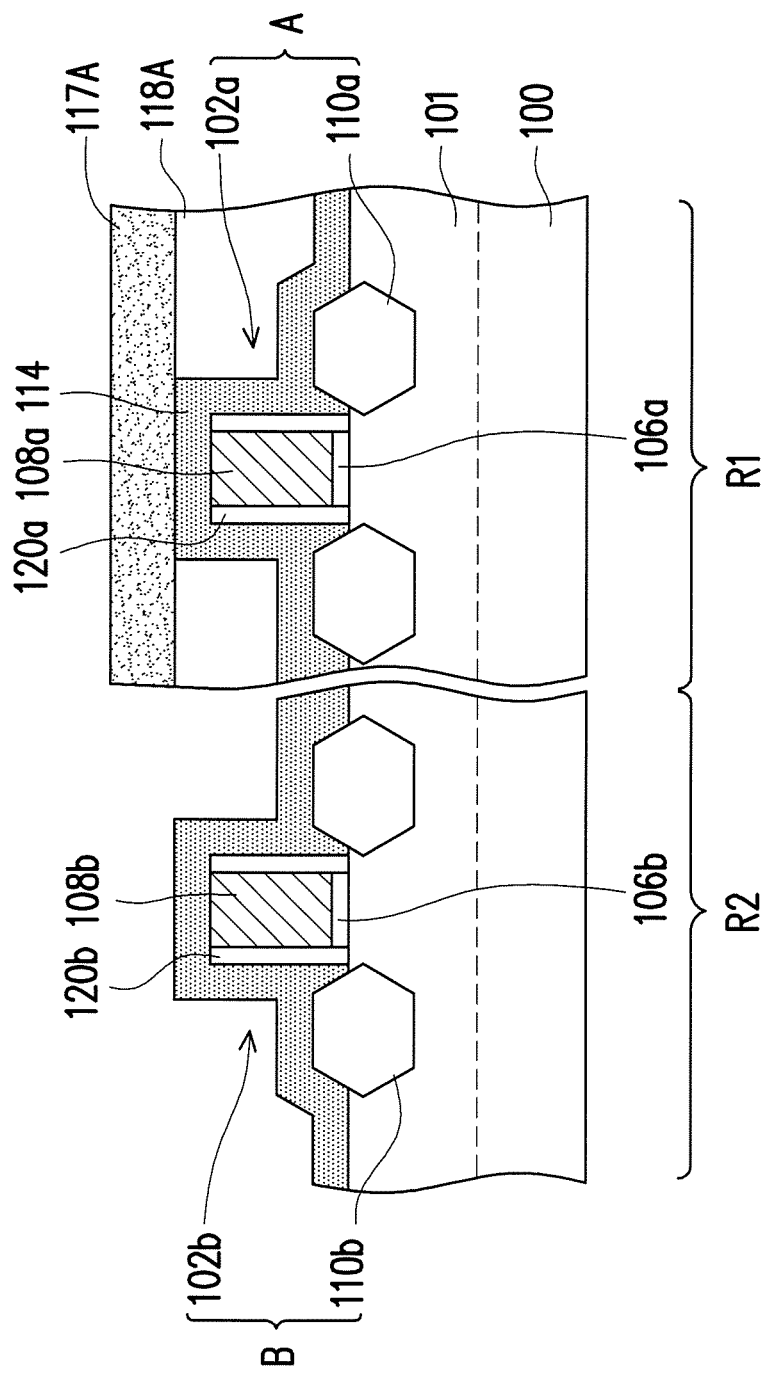

Referring to FIG. 5 and FIG. 6B, in Step S20, a portion of the first flowable oxide material 116A' in the second region R2 is removed, so that the remained first flowable oxide material 116A' is formed as a first dielectric layer 118A in the first region R1. In detail, a first mask 117A is formed over the first region R1 of the substrate 100, and the second region R2 is exposed. Then, a portion of the first flowable oxide material 116A' in the second region R2 is removed by using the first mask 117A as a mask. In some embodiments, part of the first dielectric material 116A' is removed through, for example, an etching process or other suitable processes, to expose the etch stop layer 114 in the second region R2.

Figure 6C:
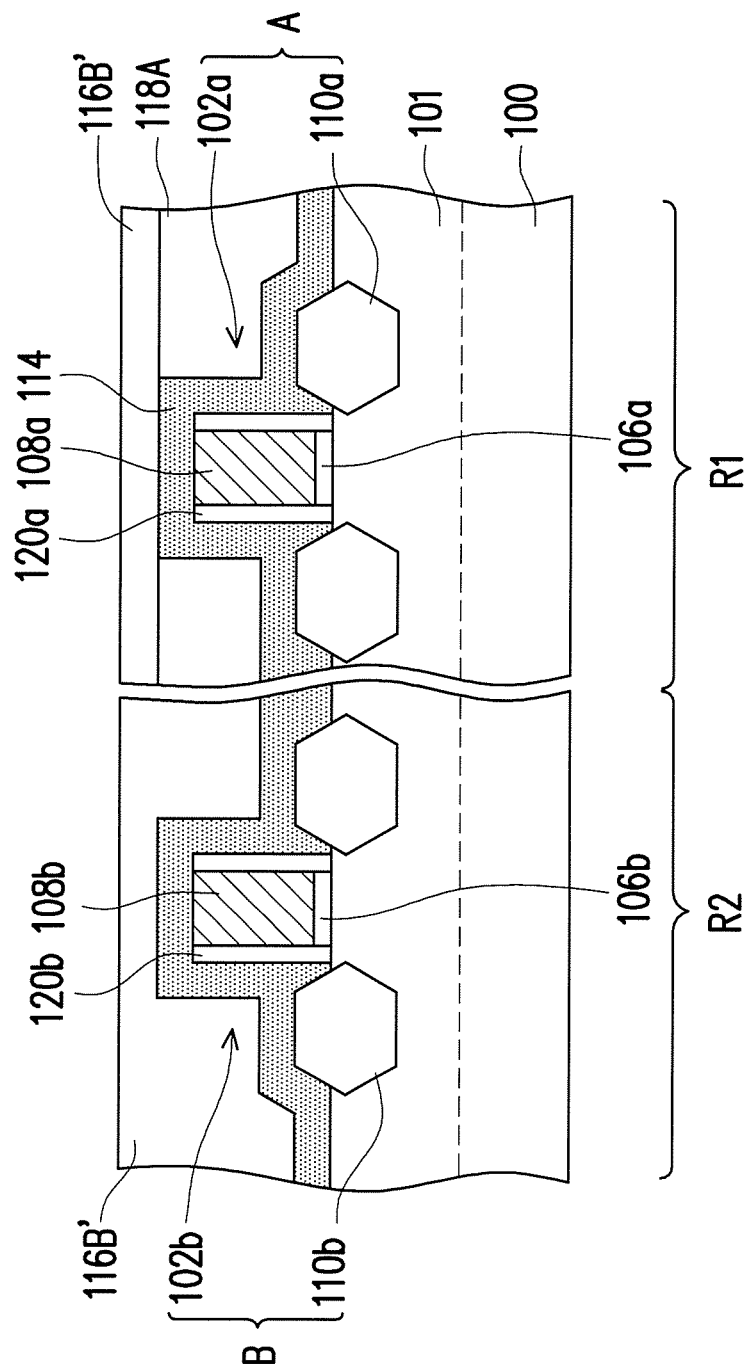

Referring to FIG. 5 and FIG. 6C, in Step S30, a second flowable oxide material 116B' is formed over the first dielectric layer 118A and the second MOS transistor B. Before forming the second flowable oxide material 116B', the first mask 117A is removed. In some embodiments, the second flowable oxide material 116B' is formed by sequentially performing a second deposition process, a second curing process, and a second annealing process. In some embodiments, the second flowable oxide material 116B' is similar to the flowable oxide material described in the embodiments in FIG. 2C. The second deposition process, the second curing process and the second annealing process are similar to the deposition process and the curing process described in the embodiments in FIG. 2C and the annealing process described in the embodiments in FIG. 2D. Thus, the detail of which are not repeated here.

It should be noted that the strains of the dielectric layer applying to the first MOS transistor and the second MOS transistor are modulated by performing the curing process, the annealing process or the combination thereof on the first flowable oxide material 116A' and the second flowable oxide material 116B'. In detail, in some embodiments, at least one of curing temperature, curing time, and other curing conditions is different in the first curing process and the second curing process, where the difference between the curing temperature in the first curing process and the curing temperature in the second curing process is at least greater than 20° C., and the difference between the curing time in the first curing process and the curing time in the second curing process is at least greater than 10 minutes. In alternative embodiment, at least one of annealing temperature, annealing time, and other annealing conditions is different in the first annealing process and the second annealing process, where the difference between the annealing temperature in the first annealing process and the annealing temperature in the second annealing process is at least greater than 50° C., and the difference between the annealing time in the first annealing process and the annealing time in the second annealing process is at least greater than 20 minutes.

Figure 6D:
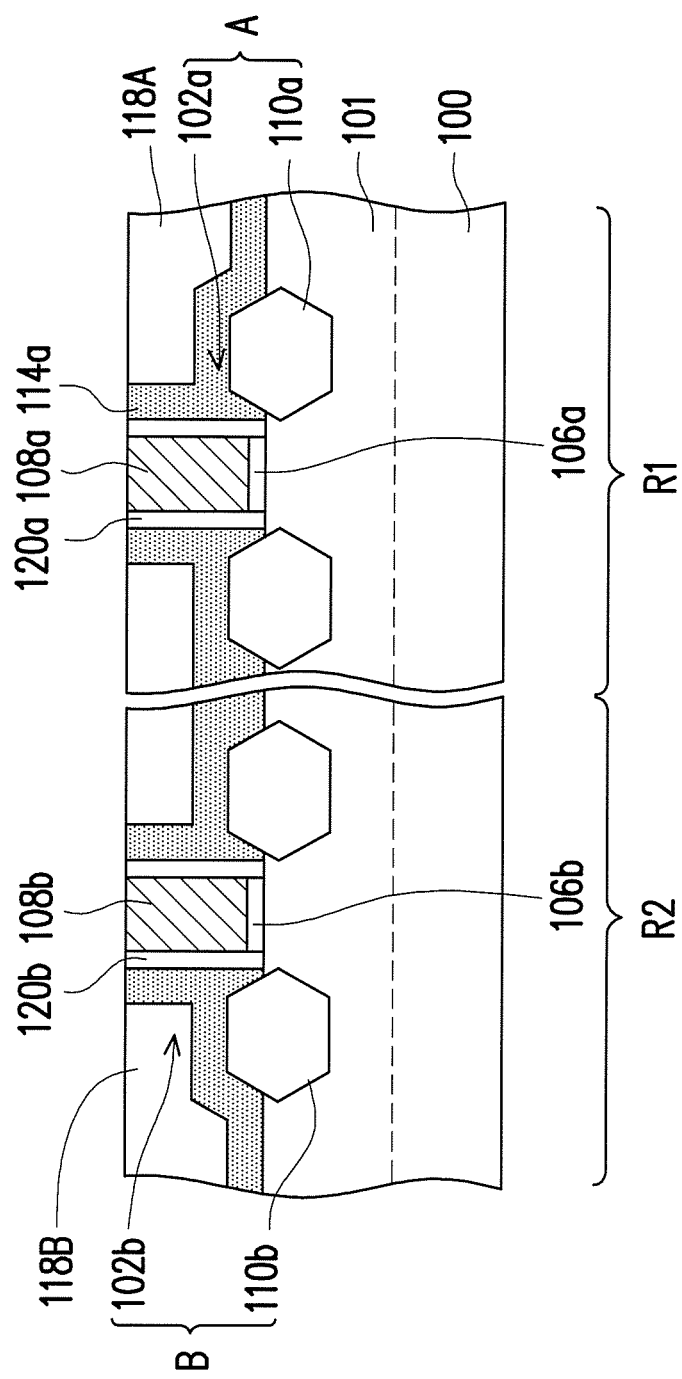

Referring to FIG. 5 and FIG. 6D, in Step S40, a portion of the second flowable oxide material 116B' in the first region R1 is removed, so that the remained second flowable oxide material 116B' is formed as a second dielectric layer 118B in the second region R2. In detail, part of the second flowable oxide material 116B' is removed through, for example, a chemical mechanical polishing (CMP) process, an etching process, or other suitable processes, to expose a top surface of the first dielectric layer 118A, a top surface of the first gate electrode 108a, and a top surface of the second gate electrode 108b.

In alternative embodiments, after forming the first and second dielectric layers 118A, 118B, a doping process is performed on at least one of the first dielectric layer 118A and the second dielectric layer 118B. During performing the doping process on the first dielectric layer 118A, a first mask is formed over the second region to shield the second dielectric layer 118B. Similarly, during performing the doping process on the second dielectric layer 118B, a second mask is formed over the first region to shield the first dielectric layer 118A.

Figure 6E:
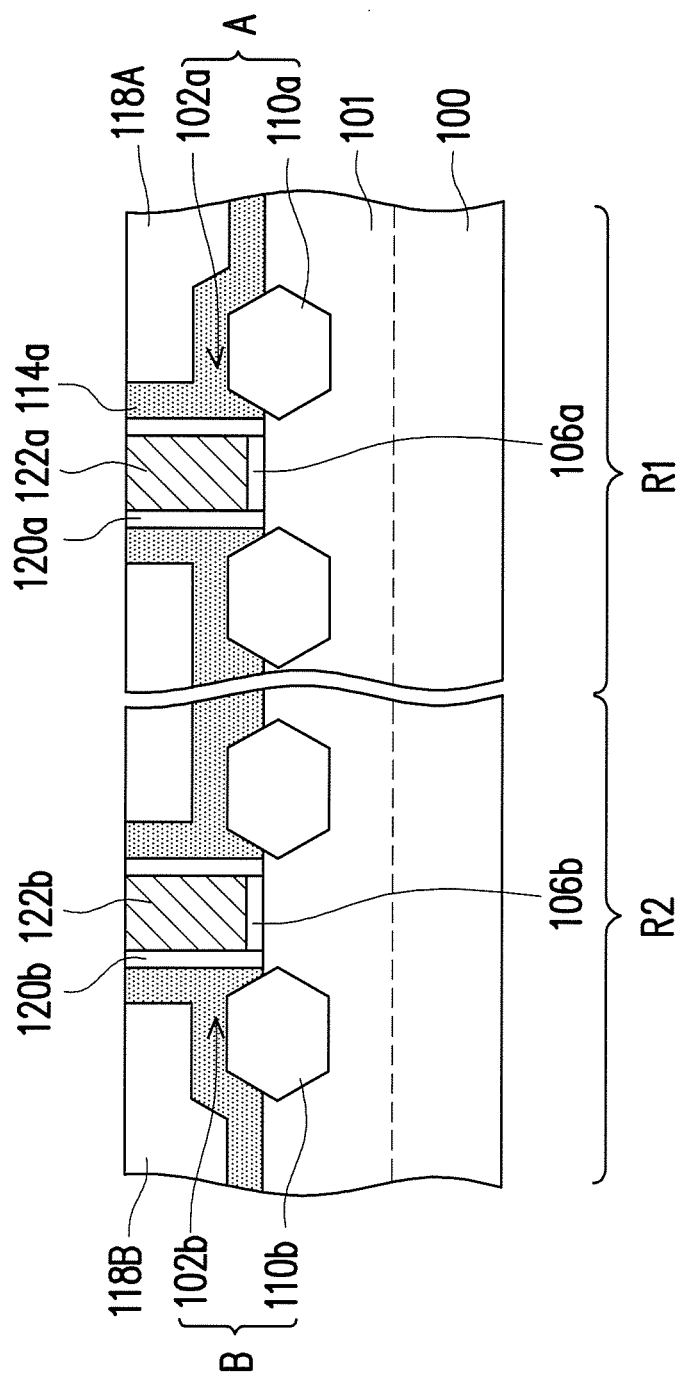

Referring to FIG. 5 and FIG. 6E, in Step S50, in some embodiments, the first gate electrode 108a and the second gate electrode 108b are dummy gate electrodes, and are being replaced respectively by a first gate electrode 122a and a second gate electrode 122b. In some embodiments, the semiconductor device depicted in FIG. 6E is similar to the semiconductor device depicted in FIG. 2F, and thus it is not repeated here.

In some embodiments, by controlling at least one of curing conditions and annealing conditions (e.g., time and temperature), the first dielectric layer 118A and the second dielectric layer 118B are formed over the first region R1 and the second region R2 respectively with different strains. Thus, the mobility of the first MOS transistor A and the mobility of the second MOS transistor B are fine tuned.

In some embodiments, the strains of the dielectric layer applying to the first MOS transistor and the second MOS transistor are modulated by at least one of the curing process, the annealing process and the doping process. In some embodiments, at least one of dopant concentration, H—N bonding and porosity of the dielectric layer is different in the first region and the second region, where the first and second MOS transistors are disposed respectively in the first and second regions. In some embodiments, by forming the first dielectric layer and the second dielectric layer respectively over the first region and the second region, the strain of the first dielectric layer applying to the first MOS transistor and the strain of the second dielectric layer applying to the second MOS transistor are different. In other words, the strain of the dielectric layer applying to the p-type MOS and the n-type MOS can be easily modulated, and thus the mobility of the p-type MOS and the mobility of the n-type MOS are fine tuned. Furthermore, since the curing process, the annealing process and the doping process are existing processes in the current semiconductor device manufacturing method, and thus the method for tuning the strain of the dielectric layer is simplified without increasing cost.

A semiconductor device includes a substrate, a p-type MOS transistor, an n-type MOS transistor and a cured flowable oxide layer. The substrate includes a first region and a second region. The p-type MOS transistor is in the first region. The n-type MOS transistor is in the second region. The cured flowable oxide layer covers the p-type MOS transistor and the n-type MOS transistor, wherein a first strain of the cured flowable oxide layer applying to the p-type MOS transistor is different from a second strain of the cured flowable oxide layer applying to the n-type MOS transistor, and the difference therebetween is greater than 0.002 Gpa.

A semiconductor device includes a substrate, a p-type MOS transistor, an n-type MOS transistor and a cured flowable oxide layer. The substrate includes a first region and a second region. The p-type MOS transistor is in the first region. The n-type MOS transistor is in the second region. The cured flowable oxide layer covers the p-type MOS transistor and the n-type MOS transistor, wherein at least one of dopant concentration, H—N bonding and porosity of the dielectric layer is different in the first region and the second region.

A manufacturing method of a semiconductor device includes at least the following steps. A substrate including a first region and a second region is provided. A first MOS transistor in the first region and a second MOS transistor in the second region are formed. A first flowable oxide material is formed over the substrate. A portion of the first flowable oxide material in the second region is removed, so that the remained first flowable oxide material in the first region forms a first dielectric layer. A second flowable oxide material is formed over the substrate. A portion of the second flowable oxide material in the first region is removed, so that the remained second flowable oxide material in the second region forms a second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate, including a first region and a second region;
a p-type MOS transistor in the first region;
an n-type MOS transistor in the second region; and
a cured flowable oxide layer covering the p-type MOS transistor and the n-type MOS transistor, wherein a first strain of the cured flowable oxide layer applying to the p-type MOS transistor is different from a second strain of the cured flowable oxide layer applying to the n-type MOS transistor, where the difference therebetween is greater than 0.002 Gpa, wherein the cured flowable oxide layer is doped with a dopant selected from a group consisting of Sb, Sn, Ga, and In.

2. The semiconductor device according to claim 1, further comprising a contact etch stop layer between the cured flowable oxide layer and the substrate.

3. The semiconductor device according to claim 2, wherein the contact etch stop layer does not cover the top surfaces of the gates of the p-type MOS transistor and the n-type MOS transistor.

4. The semiconductor device according to claim 1, wherein the cured flowable oxide layer is further doped with a dopant selected from a group consisting of Group VIIIA and Group IIIA to Group VA.

5. The semiconductor device according to claim 1, wherein a dopant concentration of the cured flowable oxide layer is about $1\times10^{15}$ to $1\times10^{16}$ atom/cm$^2$.

6. The semiconductor device according to claim 1, wherein the first strain and the second strain are selected from tensile strain and compressive strain.

7. A semiconductor device, comprising:
a substrate, including a first region and a second region;
a p-type MOS transistor in the first region;
an n-type MOS transistor in the second region; and
a cured flowable oxide layer covering the p-type MOS transistor and the n-type MOS transistor, wherein at least one of dopant concentration, H—N bonding and porosity of the cured flowable oxide layer is different in the first region and the second region, wherein the cured flowable oxide layer is doped with a dopant selected from a group consisting of Sb, Sn, Ga, and In.

8. The semiconductor device according to claim 7, further comprising a contact etch stop layer between the cured flowable oxide layer and the substrate.

9. The semiconductor device according to claim 8, wherein the contact etch stop layer does not cover the top surfaces of the gates of the p-type MOS transistor and the n-type MOS transistor.

10. The semiconductor device according to claim 7, wherein the cured flowable oxide layer in at least one of the first and second regions is doped.

11. The semiconductor device according to claim 7, wherein the cured flowable oxide layer in at least one of the first and second regions is further doped with a dopant selected from a group consisting of Group VIIIA and Group IIIA to Group VA.

12. The semiconductor device according to claim 7, wherein the difference between the dopant concentration of the cured flowable oxide layer in the first region and the dopant concentration of the cured flowable oxide layer in the second region is greater than $1\times10^{15}$ atom/cm$^2$.

13. The semiconductor device according to claim 7, wherein the difference between the H—N bonding of the cured flowable oxide layer in the first region and the H—N bonding of the cured flowable oxide layer in the second region is greater than 5%.

14. The semiconductor device according to claim 7, wherein the difference between the porosity of the cured flowable oxide layer in the first region and the porosity of the cured flowable oxide layer in the second region is greater than 3%.

* * * * *